(12) United States Patent
Zhang et al.

(10) Patent No.: US 10,706,947 B2
(45) Date of Patent: Jul. 7, 2020

(54) SHIFT REGISTER UNIT AND DRIVING METHOD THEREOF, GATE DRIVING CIRCUIT, AND DISPLAY DEVICE

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Jie Zhang, Beijing (CN); Jun Fan, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 0 days.

(21) Appl. No.: 16/302,366

(22) PCT Filed: Feb. 22, 2018

(86) PCT No.: PCT/CN2018/076963
§ 371 (c)(1),
(2) Date: Nov. 16, 2018

(87) PCT Pub. No.: WO2018/177047
PCT Pub. Date: Oct. 4, 2018

(65) Prior Publication Data
US 2019/0295674 A1 Sep. 26, 2019

(30) Foreign Application Priority Data

Mar. 31, 2017 (CN) .......................... 2017 1 0209155

(51) Int. Cl.
*G11C 19/28* (2006.01)
*G09G 3/36* (2006.01)
*G09G 3/20* (2006.01)

(52) U.S. Cl.
CPC .............. *G11C 19/287* (2013.01); *G09G 3/20* (2013.01); *G09G 3/3674* (2013.01); *G11C 19/28* (2013.01);
(Continued)

(58) Field of Classification Search
USPC ........................................... 345/55
See application file for complete search history.

(56) References Cited

U.S. PATENT DOCUMENTS

2006/0291610 A1* 12/2006 Lo .......................... G11C 19/28
377/64
2012/0163528 A1* 6/2012 Jang ..................... G09G 3/3688
377/64

(Continued)

*Primary Examiner* — Chineyere D Wills-Burns
(74) *Attorney, Agent, or Firm* — Nath, Goldberg & Meyer; Joshua B. Goldberg (57) ABSTRACT

The present application provides a shift register unit including: an input sub-circuit coupled to an input terminal, an first voltage terminal and an pull-up node; an output sub-circuit coupled to the pull-up node and art first clock terminal; a first storage sub-circuit having two terminals respectively coupled to the pull-up node and an output terminal; a first reset sub-circuit coupled to an reset terminal, an second voltage terminal, the pull-up node and the output terminal; a second reset sub-circuit coupled to a second clock terminal and a pull-down node; a pull-down sub-circuit coupled to the pull-down node, the second voltage terminal and the output terminal; and a spacing sub-circuit coupled to the pull-up node, the pull-down node and the second voltage terminal. The present application further provides a driving method of a shift register unit, a gate driving circuit and a display device.

17 Claims, 3 Drawing Sheets

(52) U.S. Cl.
CPC . *G09G 2310/0286* (2013.01); *G09G 2310/08* (2013.01)

(56) References Cited

U.S. PATENT DOCUMENTS

| | | | |
|---|---|---|---|
| 2014/0104152 A1* | 4/2014 | Ma | G09G 3/3677 |
| | | | 345/100 |
| 2016/0172054 A1* | 6/2016 | Shao | G11C 19/184 |
| | | | 345/100 |
| 2016/0225336 A1* | 8/2016 | Gu | G11C 19/28 |
| 2016/0314850 A1* | 10/2016 | Gu | G11C 19/28 |
| 2016/0351156 A1* | 12/2016 | Wu | G11C 19/28 |
| 2018/0047327 A1* | 2/2018 | Wang | G11C 19/28 |
| 2018/0108289 A1* | 4/2018 | Zheng | G11C 19/28 |

\* cited by examiner

SHIFT REGISTER UNIT AND DRIVING METHOD THEREOF, GATE DRIVING CIRCUIT, AND DISPLAY DEVICE

CROSS-REFERENCE TO RELATED APPLICATION

This is a National Phase Application filed under 35 U.S.C. 371 as a national stage of PCT/CN2018/076963, filed Feb. 22, 2018, an application claiming the benefit of Chinese Application No. 201710209155.X, filed Mar. 31, 2017, the content of each of which is hereby incorporated by reference in its entirety.

TECHNICAL FIELD

The present application relates to the field of display technology, in particular, to a shift register unit and a driving method thereof, a gate driving circuit, and a display device.

BACKGROUND

With the continuous development of the Liquid Crystal Display (LCD) technology and the increasing market competition, it is particularly urgent to improve the technical capability and the performance of the Gate Driver on Array (GOA for short). The stability of the GOA is a key consideration in the technical barriers related to performance of the GOA circuit. However, as for the current GOA circuit, there is a problem that the pull-up node PU and the pull-down node PD compete (i.e., interact) with one another, which results in a poor driving stability of the GOA and influence the yield of the display panel.

SUMMARY

The present application provides a shift register unit, which includes an input sub-circuit, an input terminal, a first voltage terminal, an output sub-circuit, an output terminal, a first clock terminal, a first reset sub-circuit, a reset terminal, a second voltage terminal, a second reset sub-circuit, a pull-down sub-circuit, a second clock terminal, a first storage sub-circuit, a pull-up node, a pull-down node, and a spacing sub-circuit; wherein:

the input sub-circuit is coupled to the input terminal, the first voltage terminal and the pull-up node, and configured to provide a signal at the first voltage terminal to the pull-up node in response to an active signal being inputted to the input terminal;

the output sub-circuit is coupled to the pull-up node and the first clock terminal, and configured to output a signal at the first clock terminal in response to a signal at the pull-up node being an active signal;

the first storage sub-circuit has two terminals coupled to the pull-up node and the output terminal, respectively, and is configured to keep a voltage difference between the pull-up node and the output terminal when the pull-up node is floating;

the first reset sub-circuit is coupled to the reset terminal, the second voltage terminal, the pull-up node and the output terminal, and configured to provide a signal at the second voltage terminal to the pull-up node and the output terminal in response to an active signal being inputted to the reset terminal;

the second reset sub-circuit is coupled to the second clock terminal and the pull-down node, and configured to provide, in response to an active signal being inputted to the second clock terminal, the signal at the second clock terminal to the pull-down node;

the pull-down sub-circuit is coupled to the pull-down node, the second voltage terminal and the output terminal, and configured to provide the signal at the second voltage terminal to the output terminal in response to a signal at the pull-down node being an active signal; and the spacing sub-circuit is coupled to the pull-up node, the pull-down node and the second voltage terminal, and configured to provide the signal at the second voltage terminal to the pull-down node in response to the signal at the pull-up node being an active signal.

Optionally, the shift register unit further includes an auxiliary pull-down sub-circuit coupled to the output terminal, the second voltage terminal and the pull-down node, and configured to provide the signal at the second voltage terminal to the pull-down sub-circuit in response to an active signal being outputted from the output terminal.

Optionally, the shift register unit further includes a second storage sub-circuit having two terminals respectively coupled to the pull-down node and the second voltage terminal.

Optionally, the input sub-circuit includes a first transistor having a control electrode coupled to the input terminal, a first electrode coupled to the first voltage terminal, and a second electrode coupled to the pull-up node;

the output sub-circuit includes a fourth transistor having a control electrode coupled to the pull-up node, a first electrode coupled to the first clock terminal, and a second electrode coupled to the output terminal;

the first reset sub-circuit includes a second transistor and a ninth transistor, wherein:

the second transistor has a control electrode coupled to the reset terminal, a first electrode coupled to the second voltage terminal, and a second electrode coupled to the pull-up node, and the ninth transistor has a control electrode coupled to the reset terminal, a first electrode coupled to the output terminal, and a second electrode coupled to the second voltage terminal;

the second reset sub-circuit includes a third transistor having a control electrode and a first electrode both coupled to the second clock terminal, and a second electrode coupled to the pull-down node;

the spacing sub-circuit includes a sixth transistor having a control electrode coupled to the pull-up node, a first electrode coupled to the pull-down node, and a second electrode coupled to the second voltage terminal; and the pull-down sub-circuit includes a seventh transistor having a control electrode coupled to the pull-down node, a first electrode coupled to the output terminal, and a second electrode coupled to the second voltage terminal.

Optionally, the auxiliary pull-down sub-circuit includes an eighth transistor having a control electrode coupled to the output terminal, a first electrode coupled to the second voltage terminal, and a second electrode coupled to the pull-down node.

Optionally, the first and the second storage sub-circuits each include a storage capacitor.

The present application further provides a gate driving circuit including a plurality of cascaded shift register units, each of which is the above shift register unit.

The present application further provides a display device including the above gate driving circuit.

The present application further provides a driving method for the above shift register unit, the driving method including steps of:

in an input stage, inputting an active signal from the input terminal, providing a voltage of the first voltage terminal to the pull-up node, and charging the pull-up node to make a signal at the pull-up node active, so that the pull-down node is coupled to the second voltage terminal so as to be discharged;

in an output stage, making the pull-up node floating, the first storage sub-circuit bootstrapping, and a signal at the pull-up node active, so that the signal at the first clock terminal is provided to the output terminal, and the pull-down node is coupled to the second voltage terminal and is discharged;

in a first reset stage, inputting an active signal to the reset terminal so that both the pull-up node and the output terminal are connected to the second voltage terminal and are discharged; and in a second reset stage, inputting an active signal to the second clock terminal so that the pull-down node is coupled to the second clock terminal and is charged, and the second signal terminal is coupled to the output terminal when a signal at the pull-down node is changed to an active signal.

Optionally, in a case where the shift register unit includes the above auxiliary pull-down sub-circuit, the driving method further includes:

in the output stage, outputting an active signal from the output terminal so that the second voltage terminal is coupled to the pull-down node.

DETAILED DESCRIPTION

The shift register unit and the driving method thereof, the gate driving circuit, and the display device provided by the present application will be described in detail below in conjunction with the drawings in order that a person skilled in the art can understand the technical solutions of the present application better.

Figure 1:
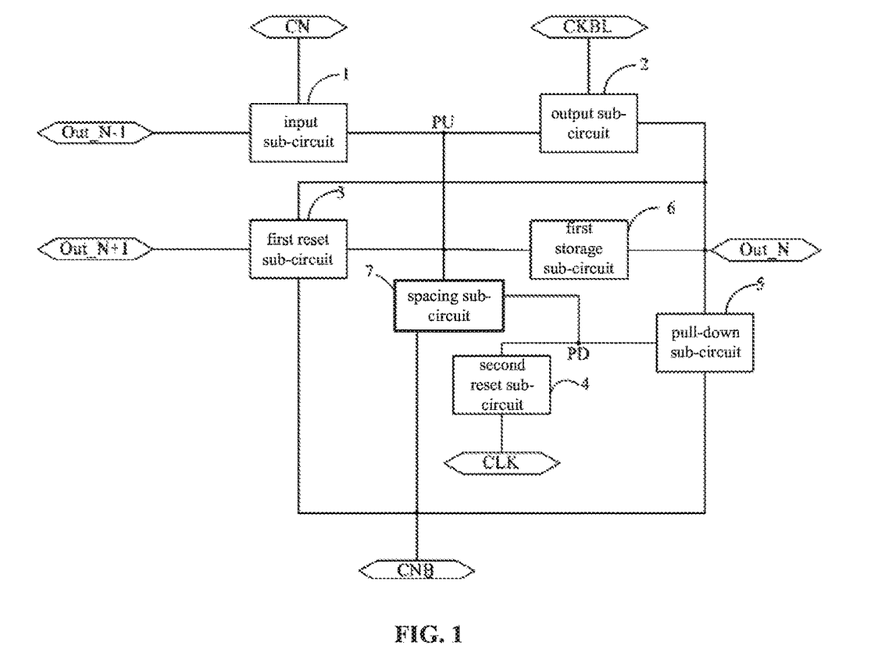
FIG. 1 is a schematic block diagram of a shift register unit according to an embodiment of the present application.

FIG. 1 is a schematic block diagram of a shift register unit according to an embodiment of the present application. As shown in FIG. 1, the shift register unit includes an input sub-circuit 1, an input terminal Out_N−1, a first voltage terminal CN, an output sub-circuit 2, an output terminal Out_N, a first clock terminal CKBL, a first reset sub-circuit 3, a reset terminal Out_N+1, a second voltage terminal CNB, a second reset sub-circuit 4, a pull-down sub-circuit 5, a second clock terminal CLK, a first storage sub-circuit 6, a pull-up node PU, a pull-down node PD, and a spacing sub-circuit 7.

The input sub-circuit 1 is coupled to the input terminal Out_N−1, the first voltage terminal CN and the pull-up node PU, and configured to provide a signal at the first voltage terminal CN to the pull-up node PU when an active signal is inputted to the input terminal Out_N−1.

The output sub-circuit 2 is coupled to the pull-up node PU and the first clock terminal CKBL, and configured to output a signal at the first clock terminal CKBL when a signal at the pull-up node PU is an active signal.

The first storage sub-circuit 6 has two terminals coupled to the pull-up node PU and the output terminal Out_N of the output sub-circuit 2, respectively, and is configured to keep a voltage difference between the pull-up node PU and the output terminal Out_N when the pull-up node PU is floating.

The first reset sub-circuit 3 is coupled to the reset terminal Out_N+1, the second voltage terminal CNB, the pull-up node PU and the output terminal Out_N of the output sub-circuit 2, and configured to provide a signal at the second voltage terminal CNB to the pull-up node PU and the output terminal Out_N when an active signal is inputted to the reset terminal Out_N+1.

The second reset sub-circuit 4 is coupled to the second clock terminal CLK and the pull-down node PD, and configured to provide a signal at the second clock terminal CLK to the pull-down node PD when an active signal is inputted to the second clock terminal CLK.

The pull-down sub-circuit 5 is coupled to the pull-down node PD, the second voltage terminal CNB and the output terminal Out_N of the output sub-circuit 2, and configured to provide the signal at the second voltage terminal CNB to the output terminal Out_N of the output sub-circuit 2 when a signal at the pull-down node PD is an active signal.

The spacing sub-circuit 7 is coupled to the pull-up node PU, the pull-down node PD and the second voltage terminal CNB, and configured to provide the signal at the second voltage terminal CNB to the pull-down node PD when the signal at the pull-up node PU is an active signal.

Figure 3:
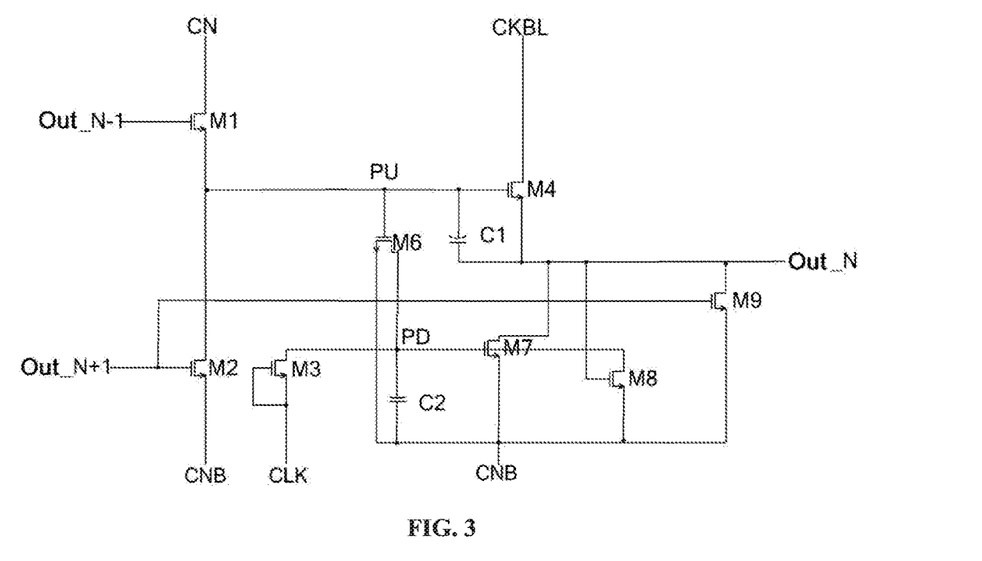
FIG. 3 is a schematic circuit diagram of the shift register unit shown in FIG. 2.

In an embodiment, the input sub-circuit 1 in FIG. 1 may include a first transistor M1 shown in FIG. 3. The first transistor M1 has a control electrode coupled to the input terminal Out_N−1, a first electrode coupled to the first voltage terminal CN, and a second electrode coupled to the pull-up node PU.

The output sub-circuit 2 may include a fourth transistor M4. The fourth transistor M4 has a control electrode coupled to the pull-up node PU, a first electrode coupled to the first clock terminal CKBL, and a second electrode serving as the output terminal Out_N.

The first reset sub-circuit 3 may include a second transistor M2 and a ninth transistor M9. The second transistor M2 has a control electrode coupled to the reset terminal Out_N+1, a first electrode coupled to the second voltage terminal CNB, and a second electrode coupled to the pull-up node PU. The ninth transistor M9 has a control electrode coupled to the reset terminal Out_N+1, a first electrode coupled to the output terminal Out_N, and a second electrode coupled to the second voltage terminal CNB.

The second reset sub-circuit 4 may include a third transistor M3. The third transistor M3 has a control electrode and a first electrode both coupled to the second clock terminal CLK, and a second electrode coupled to the pull-down node PD.

The spacing sub-circuit 7 may include a sixth transistor M6. The sixth transistor M6 has a control electrode coupled to the pull-up node PU, a first electrode coupled to the pull-down node PD, and a second electrode coupled to the second voltage terminal CNB.

The pull-down sub-circuit 5 may include a seventh transistor M7. The seventh transistor M7 has a control electrode coupled to the pull-down node PD, a first electrode coupled to the output terminal Out_N of the output sub-circuit 2, and a second electrode coupled to the second voltage terminal CNB.

The first storage sub-circuit 6 may include a first storage capacitor C1. However, in other embodiment(s), the first storage sub-circuit 6 is not limited to a storage capacitor.

Figure 2:
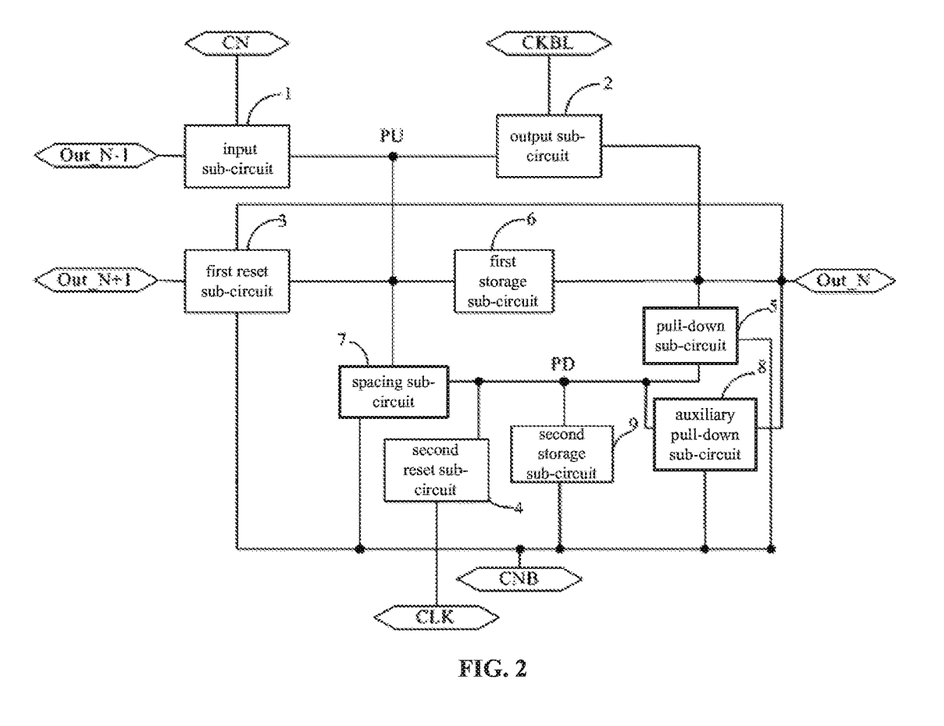
FIG. 2 is a schematic block diagram of another shift register unit according to an embodiment of the present application.

In another embodiment, as shown in FIG. 2, the shift register unit may further include an auxiliary pull-down sub-circuit 8. The auxiliary pull-down sub-circuit 8 is coupled to the output terminal Out_N of the output sub-circuit 2, the second voltage terminal CNB and the pull-down node PD, and configured to provide the signal at the second voltage terminal CNB to the pull-down sub-circuit 5 when an active signal is outputted from the output terminal Out_N of the output sub-circuit 2.

In an embodiment, as shown in FIG. 3, the auxiliary pull-down sub-circuit 8 may include an eighth transistor M8. The eighth transistor M8 has a control electrode coupled to the output terminal Out_N of the output sub-circuit 2, a first electrode coupled to the second voltage terminal CNB, and a second electrode coupled to the pull-down node PD.

In another embodiment, as shown in FIG. 2, the shift register unit may further include a second storage sub-circuit 9. The second storage sub-circuit 9 has two terminals coupled to the pull-down node PD and the second voltage terminal CNB, respectively.

In an embodiment, as shown in FIG. 3, the second storage sub-circuit 9 may include a second storage capacitor C2. It should be noted that in other embodiment(s), the second storage sub-circuit 9 is not limited to a storage capacitor.

Figure 4:
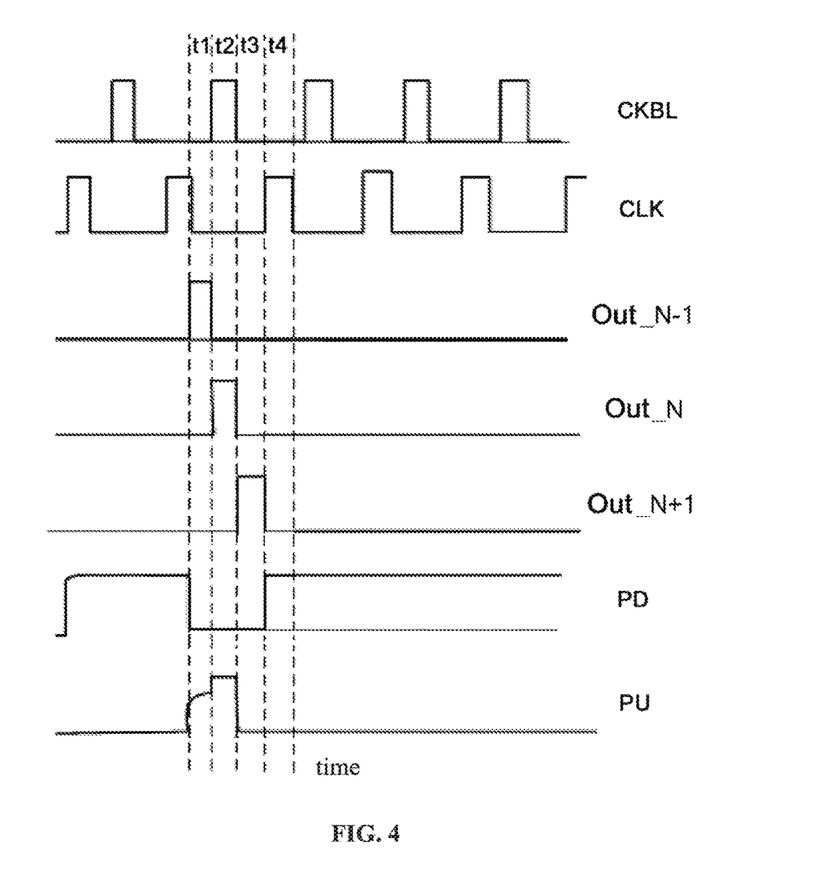
FIG. 4 is a operating timing diagram of the circuit shown in FIG. 3.

Next, a driving process of the shift register unit provided by an embodiment of the present application will be described in detail in conjunction with FIGS. 3 and 4. According to an embodiment, each of the transistors in FIG. 3 is an N-type thin film transistor which is turned on at a high level, and in this case, an active signal is a high level signal. The first voltage terminal CN is a high level terminal, and the second voltage terminal CNB is a low level terminal.

In a time period t1 (an input stage), the input terminal Out_N−1 is pulled up to a high level, and the first transistor M1 is turned on to provide a high level voltage at the first voltage terminal CN to the pull-up node PU so that the pull-up node PU is charged to a high level; the high level at the pull-up node PU causes the sixth transistor M6 to be turned on, so that the pull-down node PD is coupled to the second voltage terminal CNB and is discharged; the high level at the pull-up node PU causes the fourth transistor M4 to be turned on, and the low level signal at the first clock terminal CKBL is provided to the output terminal Out_N, that is, in this case, a low level signal is outputted from the output terminal Out_N.

In a time period t2 (an output stage), the first dock terminal CKBL is pulled up to a high level, so that a high level signal is outputted from the output terminal Out_N; since the signal at the input terminal Out_N−1 is pulled down to a low level, the first transistor M1 is turned off, so that the pull-up node PU is floating, and due to the bootstrapping effect of the fourth transistor M4, the level at the pull-up node PU becomes higher; the sixth transistor T6 remains on, so that the pull-down node PD is coupled to the second voltage terminal CNB; a high level is outputted from the output terminal Out_N, so that the eighth transistor T8 is turned on, and accordingly, the second voltage terminal CNB is coupled to the pull-down node PD and the pull-down node PD remains at a low level.

In a time period t3 (a first reset stage), the first clock terminal CKBL is pulled down to a low level, the reset terminal Out_N+1 is pulled up to a high level, and both the second transistor M2 and the ninth transistor M9 are turned on, so that both the pull-up node PU and the output terminal Out_N are coupled to the second voltage terminal CNB and their voltages are pulled down by discharging.

In a time period t4 (a second reset stage), the reset terminal Out_N+1 is pulled down to a low level; the second clock terminal CLK is pulled up to a high level, the third transistor M3 is turned on, so that the voltage at the second clock terminal CLK is provided to the pull-down node PD to charge the pull-down node PD to a high level; the pull-down node PD that is at the high level (being active) causes the seventh transistor M7 to be turned on, so that the second voltage terminal CNB is coupled to the output terminal Out_N to cause the output terminal Out_N to remain at a low level.

From the above described driving process, it can be seen that the shift register unit provided by the embodiment of the present application may not suffer from the competition between the pull-up node PU and the pull-down node PD.

With the shift register unit as shown in FIG. 1, the present application can achieve the following effects: in the input stage, the pull-up node is charged and the pull-down node is discharged; in the output stage, the first storage sub-circuit bootstraps, and a high level is inputted to the first dock terminal, causing the output sub-circuit to output a high level; in the first reset stage, the pull-up node and the output terminal both are pulled to a low level; and in the second reset stage, the pull-down node is charged and the voltage at the output terminal remains low. During the above process, since the charging-discharging process of the pull-up node and the charging-discharging process of the pull-down node do not interact with one another, the competition between the pull-up node and the pull-down node can be avoided, and thus the driving stability of the GOA can be improved, thereby facilitating the improvement of the yield of the display panel.

Furthermore, in the shift register unit according to the embodiment as shown in FIG. 2, a leakage current in the pull-down sub-circuit 5 (e.g., the seventh transistor M7 in FIG. 3) can be reduced by providing the auxiliary pull-down sub-circuit 8 (e.g., the eighth transistor M8 in FIG. 8).

By providing the second storage sub-circuit 9 (e.g., the second storage capacitor C2 in FIG. 3), stable switching between a high level and a low level at the pull-down node PD can be facilitated.

Figure 5:
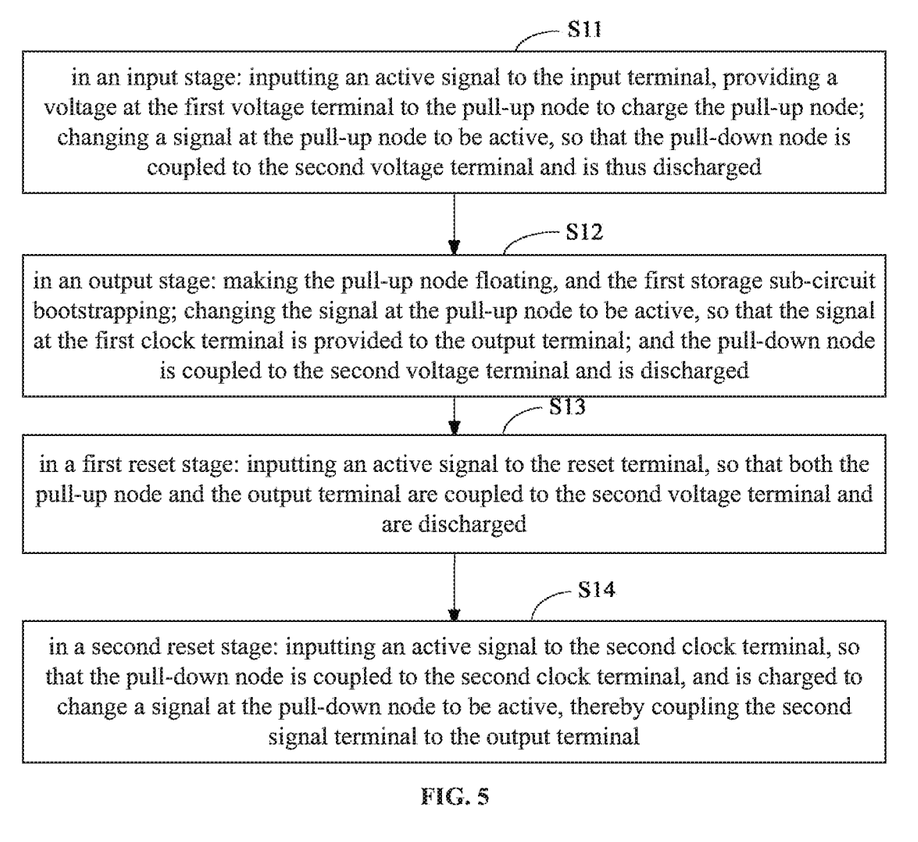
FIG. 5 is a flow chart of a driving method of a shift register unit according to an embodiment of the present application.

FIG. 5 is a flow chart of a driving method of a shift register unit according to an embodiment of the present application. Referred to FIG. 5, the driving method of a shift register unit includes steps as follow.

At Step S11 (i.e., in the input stage): an active signal is inputted to the input terminal, a voltage of the first voltage terminal is provided to the pull-up node to charge the pull-up node; a signal at the pull-up node becomes active, causing the pull-down node to be coupled to the second voltage terminal and thus to be discharged.

At Step S12 (i.e., in the output stage): the pull-up node is floating, the first storage sub-circuit bootstraps; the signal at the pull-up node becomes active, so that the signal at the first clock terminal is provided to the output terminal; the pull-down node is coupled to the second voltage terminal and is discharged.

At Step S13 (i.e., in a first reset stage): an active signal is inputted to the reset terminal so that the pull-up node and the output terminal each are coupled to the second voltage terminal and are discharged.

At Step S14 (i.e., in a second reset stage): an active signal is inputted to the second clock terminal so that the pull-down node is coupled to the second clock terminal and is charged; a signal at the pull-down node becomes active so that the second signal terminal is coupled to the output terminal.

In some embodiments, the shift register unit may further include the above auxiliary pull-down sub-circuit (e.g., the auxiliary pull-down sub-circuit 8 in FIG. 2). The auxiliary pull-down sub-circuit is coupled to the output terminal, the second voltage terminal and the pull-down node, and configured to provide the signal at the second voltage terminal to the pull-down sub-circuit when the output terminal outputs an active signal. In this case, in the output stage, the output terminal outputs an active signal, so that the second voltage terminal is coupled to the pull-down node.

By driving a shift register unit using the above method, the present application can achieve the following effects: in the input stage, the pull-up node is charged and the pull-down node is discharged; in the output stage, the first storage sub-circuit bootstraps, and a high level is inputted to the first clock terminal, causing the output sub-circuit to output a high level; in the first reset stage, the pull-up node and the output terminal both are pulled to a low level; in the second reset stage, the pull-down node is charged and the voltage at the output terminal remains low. During the above process, since the charging and discharging process of the pull-up node and the charging and discharging process of the pull-down node do not interact with one another, the competition between the pull-up node and the pull-down node can be avoided, and thus the driving stability of the GOA can be improved, thereby facilitating the improvement of the yield of the display panel.

An embodiment of the present application further provides a gate driving circuit, which includes a plurality of cascaded shift register units. The shift register units are the shift register units as described in the above embodiments. The structure and the driving method of the shift register unit have been described in detail in the embodiments as shown in FIGS. 1 to 5, and thus will not be repeated here.

It should be noted that the gate driving circuit may be an N-type gate driving circuit or may be a P-type gate driving circuit.

By applying the above shift register unit in the gate driving circuit, the driving stability of the GOA can be improved and the improvement of the yield of the display panel is facilitated.

An embodiment of the present application further provides a display device, which includes the gate driving circuit as described in the above embodiment. The contents related to the gate driving circuit may refer to the contents in the above embodiment, and will not be repeated here.

In some embodiments, the display device may be a touch display device. For example, it may be a LHB (Long Horizontal Blanking)-based touch display device.

By applying the above shift register unit in the display device, the yields of the display panel and the display device can be improved.

It could be appreciated that the above implementations are exemplary implementations simply for illustrating the principle of the present application, but the present application is not limited thereto. A person of ordinary skill in the art may make various modifications and variations without departing from the spirit and the protection scope of the present application.

What is claimed is:

1. A shift register unit, comprising an input sub-circuit, an input terminal, a first voltage terminal, an output sub-circuit, an output terminal, a first clock terminal, a first reset sub-circuit, a reset terminal, a second voltage terminal, a second reset sub-circuit, a pull-down sub-circuit, a second clock terminal, a first storage sub-circuit, a pull-up node, a pull-down node, and a spacing sub-circuit; wherein the input sub-circuit is coupled to the input terminal, the first voltage terminal and the pull-up node, and configured to provide a signal at the first voltage terminal to the pull-up node in response to an active signal being inputted to the input terminal, the output sub-circuit is coupled to the pull-up node and the first clock terminal, and configured to output a signal at the first clock terminal in response to a signal at the pull-up node being an active signal, the first storage sub-circuit has two terminals coupled to the pull-up node and the output terminal, respectively, and is configured to keep a voltage difference between the pull-up node and the output terminal when the pull-up node is floating, the first reset sub-circuit is coupled to the reset terminal, the second voltage terminal, the pull-up node and the output terminal, and configured to provide a signal at the second voltage terminal to both the pull-up node and the output terminal in response to an active signal being inputted to the reset terminal, the second reset sub-circuit is coupled to the second clock terminal and the pull-down node, and configured to provide, in response to an active signal inputted to the second clock terminal, the active signal inputted to the second clock terminal to the pull-down node, the pull-down sub-circuit is coupled to the pull-down node, the second voltage terminal and the output terminal, and configured to provide the signal at the second voltage terminal to the output terminal in response to a signal at the pull-down node being an active signal, and the spacing sub-circuit is coupled to the pull-up node, the pull-down node and the second voltage terminal, and configured to provide the signal at the second voltage terminal to the pull-down node in response to the signal at the pull-up node being an active signal, the shift register unit further comprising an auxiliary pull-down sub-circuit coupled to the output terminal, the second voltage terminal and the pull-down node, and configured to provide the signal at the second voltage terminal to the pull-down sub-circuit in response to an active signal being outputted from the output terminal.

2. The shift register unit of claim 1, further comprising a second storage sub-circuit having two terminals respectively coupled to the pull-down node and the second voltage terminal.

3. The shift register unit of claim 2, wherein the first storage sub-circuit and the second storage sub-circuit each comprise a storage capacitor.

4. A gate driving circuit, comprising a plurality of cascaded shift register units each of the shift register units being the shift register unit of claim 3.

5. A display device, comprising the gate driving circuit of claim 4.

6. A gate driving circuit, comprising a plurality of cascaded shift register units each of the shift register units being the shift register unit of claim 2.

7. A display device, comprising the gate driving circuit of claim 6.

8. The shift register unit of claim 1, wherein
the input sub-circuit comprises a first transistor having a control electrode coupled to the input terminal, a first electrode coupled to the first voltage terminal, and a second electrode coupled to the pull-up node,
the output sub-circuit comprises a fourth transistor having a control electrode coupled to the pull-up node, a first electrode coupled to the first clock terminal, and a second electrode coupled to the output terminal,
the first reset sub-circuit comprises a second transistor and a ninth transistor,
the second transistor having a control electrode coupled to the reset terminal, a first electrode coupled to the second voltage terminal, and a second electrode coupled to the pull-up node, and
the ninth transistor having a control electrode coupled to the reset terminal, a first electrode coupled to the output terminal, and a second electrode coupled to the second voltage terminal,
the second reset sub-circuit comprises a third transistor having a control electrode and a first electrode both coupled to the second clock terminal, and a second electrode coupled to the pull-down node,
the spacing sub-circuit comprises a sixth transistor having a control electrode coupled to the pull-up node, a first electrode coupled to the pull-down node, and a second electrode coupled to the second voltage terminal, and
the pull-down sub-circuit comprises a seventh transistor having a control electrode coupled to the pull-down node, a first electrode coupled to the output terminal, and a second electrode coupled to the second voltage terminal.

9. A gate driving circuit, comprising a plurality of cascaded shift register units each of the shift register units being the shift register unit of claim 8.

10. A display device, comprising the gate driving circuit of claim 9.

11. The shift register unit of claim 1, wherein the auxiliary pull-down sub-circuit comprises an eighth transistor having a control electrode coupled to the output terminal, a first electrode coupled to the second voltage terminal, and a second electrode coupled to the pull-down node.

12. A gate driving circuit, comprising a plurality of cascaded shift register units each of the shift register units being the shift register unit of claim 11.

13. A display device, comprising the gate driving circuit of claim 12.

14. A gate driving circuit, comprising a plurality of cascaded shift register units each of the shift register units being the shift register unit of claim 1.

15. A display device, comprising the gate driving circuit of claim 14.

16. A driving method for a shift register unit, wherein the shift register unit comprises an input sub-circuit, an input terminal, a first voltage terminal, an output sub-circuit, an output terminal, a first clock terminal, a first reset sub-circuit, a reset terminal, a second voltage terminal, a second reset sub-circuit, a pull-down sub-circuit, a second clock terminal, a first storage sub-circuit, a pull-up node, a pull-down node, and a spacing sub-circuit, wherein
the input sub-circuit is coupled to the input terminal, the first voltage terminal and the pull-up node, and configured to provide a signal at the first voltage terminal to the pull-up node in response to an active signal being inputted to the input terminal,
the output sub-circuit is coupled to the pull-up node and the first clock terminal, and configured to output a signal at the first clock terminal in response to a signal at the pull-up node being an active signal,
the first storage sub-circuit has two terminals coupled to the pull-up node and the output terminal, respectively, and is configured to keep a voltage difference between the pull-up node and the output terminal when the pull-up node is floating,
the first reset sub-circuit is coupled to the reset terminal, the second voltage terminal, the pull-up node and the output terminal, and configured to provide a signal at the second voltage terminal to both the pull-up node and the output terminal in response to an active signal being inputted to the reset terminal,
the second reset sub-circuit is coupled to the second clock terminal and the pull-down node, and configured to provide, in response to an active signal inputted to the second clock terminal, the active signal inputted to the second clock terminal to the pull-down node,
the pull-down sub-circuit is coupled to the pull-down node, the second voltage terminal and the output terminal, and configured to provide the signal at the second voltage terminal to the output terminal in response to a signal at the pull-down node being an active signal, and
the spacing sub-circuit is coupled to the pull-up node, the pull-down node and the second voltage terminal, and configured to provide the signal at the second voltage terminal to the pull-down node in response to the signal at the pull-up node being an active signal,
the driving method comprises steps of:
in an input stage, inputting an active signal to the input terminal, providing a voltage at the first voltage terminal to the pull-up node, and charging the pull-up node to make a signal at the pull-up node active, so that the pull-down node is coupled to the second voltage terminal and is discharged;
in an output stage, making the pull-up node floating, the first storage sub-circuit bootstrapping, and a signal at the pull-up node active, so that the signal at the first clock terminal is provided to the output terminal, and the pull-down node is coupled to the second voltage terminal and is discharged;
in a first reset stage, inputting an active signal to the reset terminal, so that both the pull-up node and the output terminal are coupled to the second voltage terminal and are discharged and a signal at the pull-down node is maintained to be an inactive signal; and
in a second reset stage, inputting an active signal to the second clock terminal, so that the pull-down node is coupled to the second clock terminal and is charged, and a signal at the pull-down node is changed to an active signal, so as to couple the second signal terminal to the output terminal.

17. The driving method of claim 16, wherein the shift register unit further comprises an auxiliary pull-down sub-circuit coupled to the output terminal, the second voltage terminal and the pull-down node, and configured to provide the signal at the second voltage terminal to the pull-down sub-circuit in response to an active signal being outputted from the output terminal, and the driving method further comprises:

in the output stage, outputting an active signal by the output terminal so that the second voltage terminal is coupled to the pull-down node.

\* \* \* \* \*